United States Patent
Liu et al.

(10) Patent No.: US 8,498,129 B1
(45) Date of Patent: Jul. 30, 2013

(54) POWER DISTRIBUTION NETWORK

(75) Inventors: Hui Liu, Pleasanton, CA (US); Hong Shi, Fremont, CA (US); Yuanlin Xie, Fremont, CA (US)

(73) Assignee: Altera Corporation, San Jose, CA (US)

( * ) Notice: Subject to any disclaimer, the term of this patent is extended or adjusted under 35 U.S.C. 154(b) by 231 days.

(21) Appl. No.: 13/158,034

(22) Filed: Jun. 10, 2011

(51) Int. Cl.
*H05K 1/18* (2006.01)
*H05K 7/00* (2006.01)
*H05K 1/14* (2006.01)

(52) U.S. Cl.
USPC ............ 361/764; 361/760; 361/763; 361/737

(58) Field of Classification Search
USPC .................. 361/734, 735, 736, 737, 738, 760, 361/761, 763, 764, 766, 767, 768, 777, 778, 361/782, 783, 794, 795; 257/207, 208, 532; 716/119, 120
See application file for complete search history.

(56) References Cited

U.S. PATENT DOCUMENTS

| | | | | |
|---|---|---|---|---|
| 7,412,668 B1 * | 8/2008 | Duong | ........................... | 716/108 |
| 7,773,390 B2 * | 8/2010 | Weir et al. | ..................... | 361/794 |
| 8,158,890 B1 * | 4/2012 | Chang | ........................... | 174/262 |
| 2008/0258259 A1 * | 10/2008 | Osaka et al. | .................. | 257/532 |

* cited by examiner

*Primary Examiner* — Hoa C Nguyen
*Assistant Examiner* — Binh Tran
(74) *Attorney, Agent, or Firm* — Ward & Zinna, LLC

(57) ABSTRACT

An improved power distribution network for an integrated circuit package that reduces the number of power supply pins that are used in the pin array and achieves better operating performance. In a preferred embodiment, the ratio of power supply pins to input/output (I/O) pins is in the range of approximately 1 to 24 to approximately 1 to 52. In this embodiment, the integrated circuit package comprises a substrate, an integrated circuit mounted on the substrate, a first decoupling capacitor mounted on the substrate, and a second decoupling capacitor formed in the integrated circuit. The package is formed by coupling a power supply pin to both the first and second capacitors by a low frequency path and a DC path, respectively, and the first and second capacitors are coupled by a high frequency path.

20 Claims, 3 Drawing Sheets

POWER DISTRIBUTION NETWORK

BACKGROUND

This relates to a power distribution network for an integrated circuit package.

A typical integrated circuit package includes an array of connectors on an exterior surface of the package. FIG. 1 depicts an illustrative example of a portion of one such array 100 of connectors 110 on a package substrate 130. Connectors 110 are solder balls or solder bumps and will be referred to collectively hereafter as "pins." The pins are organized in groups 120 that are referred to as "banks." Within each bank 120 in a typical package, there is one power supply pin 112 for every eight to twelve input/output (I/O) signal pins 114. Thus, for a typical bank of 40 to 50 pins, there are three to five power supply pins distributed among the pins of the bank. The number of pins and the number of banks varies widely with the type of integrated circuit package. For some packages, the number of pins is well in excess of 1000.

Array 100 is formed on the exterior surface of package substrate 130. Substrate 130 is a multi-layer structure comprising a series of electrically conducting metal layers that are insulated from one another by intermetallic dielectric layers. Each of the layers is substantially parallel to the exterior surface of the package. Interconnection paths are defined in the metal layers; and selective connections are made by vias between the paths in the various layers so as to connect the pins of array 100 to bonding pads (not shown) on the interior surface of substrate 130 opposite the exterior surface. At least one of the metal layers is used to interconnect the power supply pins 112. Further details on package substrates are found in R. R. Tummala (Ed.), *Fundamentals of Microsystems Packaging* (McGraw-Hill 2001), which is incorporated herein by reference.

As a result of these arrangements, a substantial number of the available pins are used for power supply, thereby reducing the number of pins available for use as input/output signal pins or requiring the use of a larger substrate to accommodate more I/O pins. Further, distributing the power supply pins complicates the layout of the pins and imposes constraints that are likely to make the final arrangement of pins less than optimal. The need to connect the power supply pins with a metal layer embedded in the substrate further complicates the design of the package substrate and may increase the layer count.

The performance of a typical circuit with a relatively large number of power supply pins is also less than desired. Within the frequency range of operation for these circuits, which is approximately 1 MHz to approximately 1 GHz, the system level impedance of these circuits varies substantially and has two peaks. Moreover, the lower frequency impedance peak exceeds the desired impedance by a factor of about 2.

SUMMARY

The present invention is an improved power distribution network and method for forming same for an integrated circuit package that reduces the number of power supply pins that are used in the pin array and achieves better operating performance.

In an embodiment of the invention, the ratio of power supply pins to input/output (I/O) pins is as low as approximately 1 to 52. In this embodiment, the integrated circuit package comprises a substrate, an integrated circuit mounted on the substrate, a first capacitor mounted on the substrate, and a second capacitor formed in the integrated circuit. The power distribution network is formed by coupling a power supply pin to both the first and second capacitors by a low frequency path and a DC path, respectively, and the first and second capacitors are coupled by a high frequency path. This reduction in the number of power supply pins is achieved, in part, by substantial increases in the capacitance and equivalent series resistance of the first capacitor.

BRIEF DESCRIPTION OF THE DRAWINGS

These and other objects and advantages of the present invention will be apparent to those of ordinary skill in the art in view of the following detailed description in which.

In the drawings like elements have been identified by like numbers.

DETAILED DESCRIPTION

Figure 1:
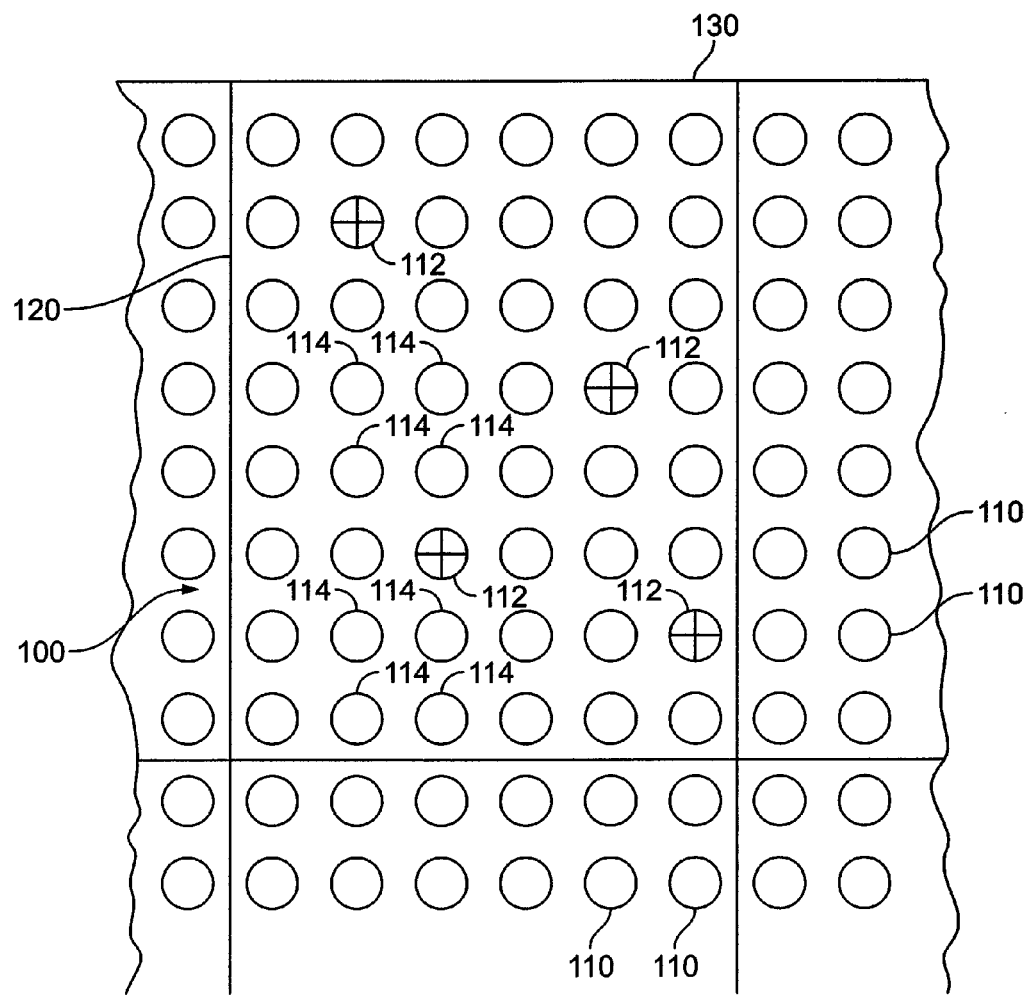
FIG. 1 is an illustration of a prior art pin array on the exterior of an integrated circuit package.
Figure 2:
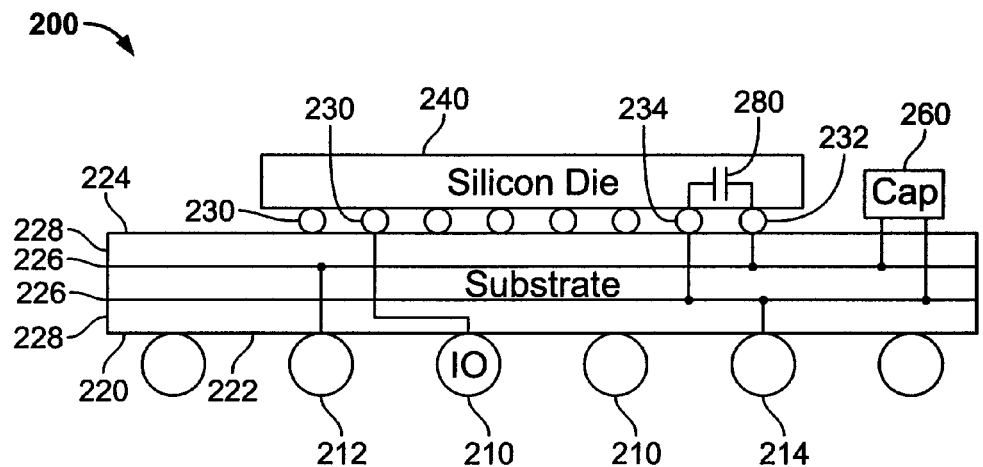
FIG. 2 is a side view of an illustrative embodiment of the invention.

FIG. 2 is a side view of an illustrative embodiment of an integrated circuit package 200 of the invention. Package 200 comprises a package substrate 220, an integrated circuit, or die, 240, an on package decoupling capacitor 260, and an on die decoupling capacitor 280. Connectors, or pins, 210 are located on an exterior surface 222 of substrate 220 to couple to the next level of packaging such as a printed circuit board; and connectors, or pins, 230 are located on an interior surface 224 of substrate 220 to provide electrical and mechanical connection to integrated circuit 240.

Within substrate 220 are a series of electrically conducting metal layers 226 that are insulated from one another by dielectric layers 228 that constitute most of the remainder of the substrate. Illustratively, the metal layers are copper; and the dielectric layers are an epoxy-resin such as FR-4.

Integrated circuit 240 can be any conventional integrated circuit with an on die capacitor. The integrated circuit comprises a semiconductor substrate, such as silicon, in which various devices are formed and a series of metal interconnect layers separated by insulating dielectric layers that overlie the semiconductor substrate. On die capacitors are typically formed using two of the upper metal layers and an intervening insulating dielectric layer. Alternatively, on die capacitors can be formed as trench capacitors.

Interconnection paths are defined in the metal layers 226 of substrate 220 and selective connections are made by vias between the paths in the various layers so as to connect pins 210 to pins 230 and to on package capacitor 260. In the interests of clarity, several of the metal layers and many of the connections between pins 210 and pins 230 are not depicted in FIG. 2; but it will be understood by those skilled in the art that most, if not all, of pins 210 and pins 230 are connected to paths through the metal layers.

Of particular interest are the paths that extend from power and ground pins 212, 214 through metal layers 226 to couple a power supply and ground to on package capacitor 260; the paths that extend from the power and ground pins 212, 214 through the metal layers and power and ground pins 232, 234 to couple the power supply and ground to the on die capacitor 280; and the paths that extend through the metal layers from the on package capacitor 260 to the on die capacitor 280 to connect these capacitors 48 I/O pins. The values set forth above for Cases 1-3 are only illustrative and not intended to limit the scope of the invention. As such, the invention may be practiced for other ratios of power supply pin to I/O pins as described below and for circuit elements having numerous other values.

TABLE I

| Case | PowerPins | Zpeak to Ztarget Ratio | | | L1(pH) | C1(nF) | L3 + L4(pH) | R1(mΩ) |
| | | LFPeak | HFPeak | DC | | | | |
| --- | --- | --- | --- | --- | --- | --- | --- | --- |
| Case0 | 4 | 2.04 | 0.95 | 0.20 | 703 | 8.2 | 133 | 63 |
| Case1 | 1 | 0.60 | 0.98 | 0.22 | 2812 | 47 | 173 | 150 |
| Case2 | 1 | 0.01 | 1.11 | 0.22 | 2812 | 1000 | 223 | 220 |
| Case3 | 1 | 0.02 | 0.96 | 0.22 | 2812 | 1000 | 223 | 470 |

Figure 3:
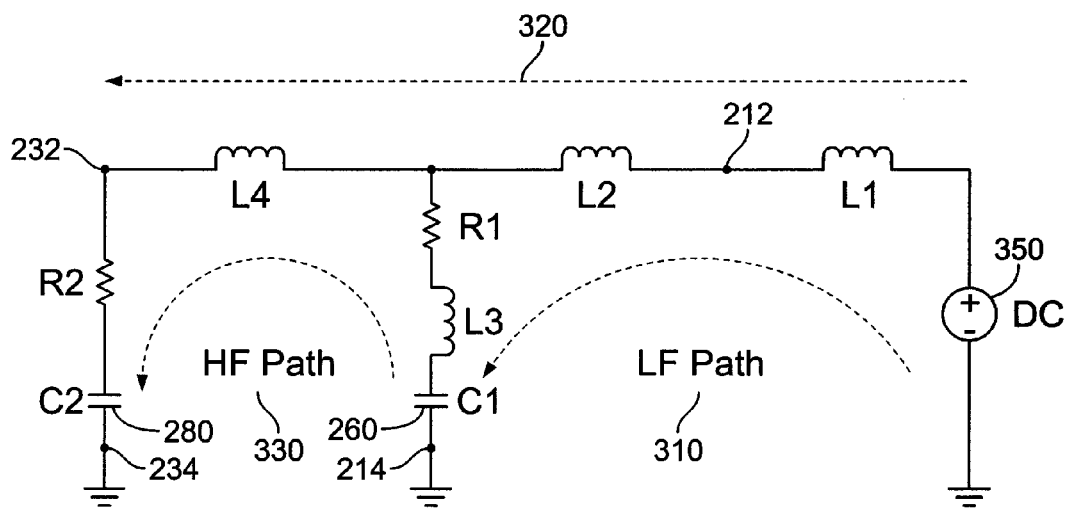
FIG. 3 is an illustrative circuit diagram for the embodiment of FIG. 2.

FIG. 3 is an illustrative circuit diagram depicting these paths. A first path 310 is from a power supply 350 through external circuitry such as a printed circuit board to a power pin 212 on substrate 220 and from there through the substrate to on package capacitor 260. A return path from capacitor 260 goes through the substrate and ground pin 214 to ground. A second path 320 is from power supply 350 through external circuitry to power pin 212 on substrate 220 and from there through substrate 220 to power pin 232 and then through die 240 to on die capacitor 280. A return path from capacitor 280 goes through die 240 and ground pin 234 and substrate 220 and ground pin 214 to ground. A third path 330 is from on package capacitor 260 through substrate 220, power pin 232 and die 240 to on die capacitor 280.

Each of these paths has a resistance, an inductance, and a capacitance. In first path 310, there are an inductance L1 in the external circuitry, an inductance L2 in the substrate 220, and the capacitance C1 of on package capacitor 260. There is also a parasitic equivalent series inductance L3 and equivalent series resistance R1 associated with capacitor 260. In second path 320, there are inductance L1 in the external circuitry and inductances L2 and L4 in the substrate in the path between power pin 212 and power pin 232. There are also the equivalent series resistance R2 and the capacitance C2 of the on die capacitor 280. The equivalent series inductance of the on die capacitor is minimal and can be ignored. In third path 330, there are the capacitance C1 of the on package capacitor 260 and its parasitic equivalent series resistance R1 and inductance L3, the inductance L4 of the path through the substrate from on package capacitor 260 to pin 232, the capacitance C2 of the on die capacitor 280 and its parasitic equivalent series resistance R2.

The circuit of FIG. 3 is formed by providing three current paths: 310, 320, and 330. Path 320 is a direct current (DC) path from pin 212 all the way to the on die capacitor 280. Path 310 is a low frequency (LF) path from pin 212 to on package capacitor 260: and path 330 is a high frequency (HF) path from on package capacitor 260 to on die capacitor 280. As a result, the DC path through the substrate from pin 212 to pin 232 is a low resistance path and the IR drop in this path is low. At the same time, there is significant equivalent series resistance in both the LF path 310 and the HF path 320 This resistance minimizes the system impedance peaks and reduces AC noise. The reduction in IR drop and AC noise also reduce switching jitter.

Illustrative values for certain of these resistances, capacitances and inductances are set forth in Table I below for a power distribution network that has four power supply pins per 48 I/O pins (Case 0) and for three examples (Cases 1-3) of power distribution networks that have 1 power supply pin per For all of these cases, the capacitance C2 of the on die capacitor 280 was the same and was approximately 1 to 2 nF. The equivalent series resistance R2 of the on die capacitor was also the same in all cases and was approximately 50 mOhms. The inductance L2 of the package substrate was also the same in all cases and was approximately 150 pH.

As will be apparent, for each of the Cases 1-3 where only a single power pin was used, the maximum impedance was less than or close to the desired target impedance.

Figure 4:
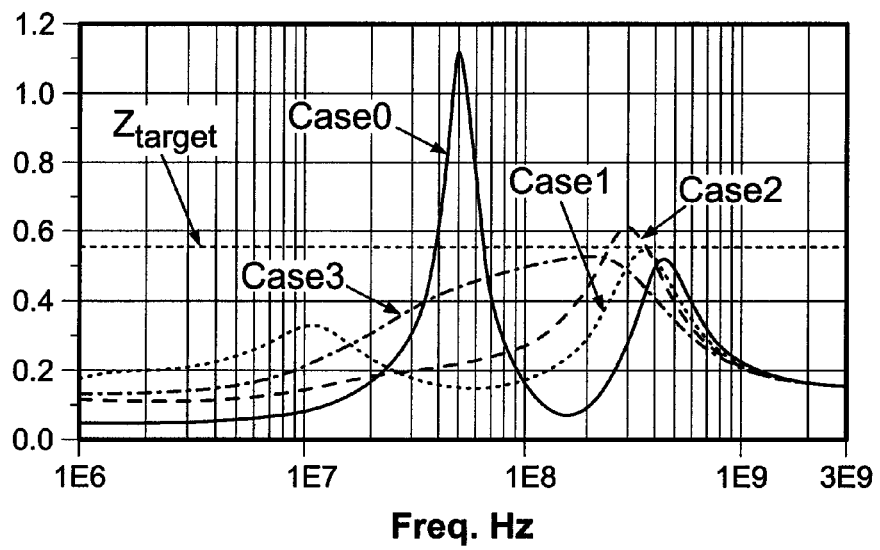
FIG. 4 is an illustrative plot of system level impedance versus frequency comparing the performance of various embodiments of the invention with a prior art circuit.

FIG. 4 is an illustrative plot of the system level impedance of the power distribution network versus operating frequency for the four cases that are the subject of Table I. For Case 0, the low frequency impedance peak is at about 50 MHz and is more than twice the desired or target impedance. The high frequency peak is between 400 and 500 MHz. Case 1 has a low frequency impedance peak near 10 MHz and a high frequency peak between 300 and 400 MHZ. For Cases 2 and 3, the low frequency peak is not readily discernible. The high frequency peak for Case 2 is at about 300 MHz; and the high frequency peak for Case 3 is at about 200 MHz.

Figure 5:
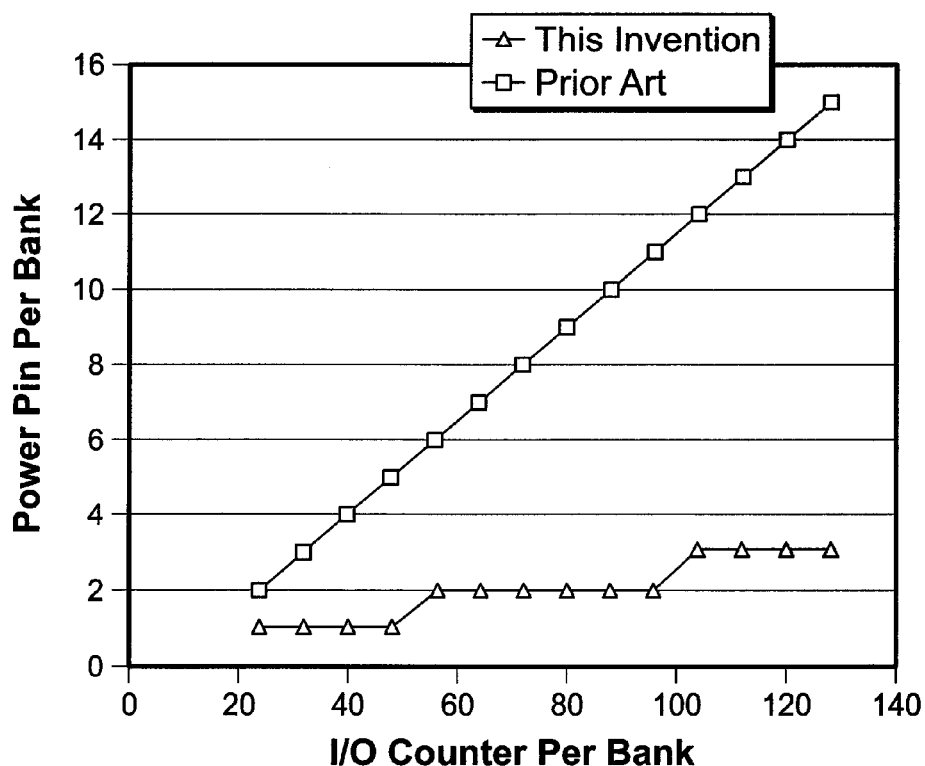
FIG. 5 is an illustrative plot comparing the requirements for power supply pins in accordance with embodiments of the present invention with the requirements in a prior art circuit.

FIG. 5 is an illustrative plot comparing the number of power pins per bank versus the number of I/O pins per bank for an illustrative prior art device such as the assignee's S4GX device and what can be achieved with the present invention. As indicated, in the prior art device for every increase of eight I/O pins, there is an increase of one in the number of power supply pins; and this requirement continues no matter what the size of bank. In contrast, in one embodiment of the present invention, one power supply pin may be used for approximately 24 to 52 I/O pins and two power supply pins may be used for approximately 52 to 96 I/O pins.

As will be apparent to those skilled in the art, numerous variations may be practiced within the spirit and scope of the present invention.

What is claimed is:

1. A power distribution network comprising:
   a substrate having first and second opposing surfaces and electrical interconnection paths running between the first and second surfaces;
   an array of pins on the first surface of the substrate and coupled to the electrical interconnection paths in the substrate, wherein a ratio of power supply pins to input/output signal pins of the array of pins ranges between approximately 1:24 to 1:52;
   a first capacitor mounted on the second surface of the substrate and coupled to at least a pin of said array of pins via a first electrical interconnection path of the electrical interconnection paths;

an integrated circuit mounted on the second surface of the substrate and coupled to the electrical interconnection paths; and a second capacitor formed in the integrated circuit, wherein the second capacitor is coupled to at least a pin of the array of pins via a second electrical interconnection path of the electrical interconnection paths, wherein the second capacitor is coupled to the first capacitor via a third electrical interconnection path of the electrical interconnection paths.

2. The power distribution network of claim 1, wherein a capacitance of the first capacitor ranges between approximately 47 and 1000 nFarads and an equivalent series resistance of the first capacitor ranges between 150 and 470 mOhms.

3. The power distribution network of claim 1, wherein the first electrical interconnection path includes a substrate inductance, a capacitance of the first capacitor, and an equivalent series inductance and an equivalent series resistance of the first capacitor.

4. The power distribution network of claim 3, wherein a capacitance of the first capacitor ranges between approximately 47 and 1000 nFarads and an equivalent series resistance of the first capacitor ranges between approximately 150 to 470 mOhms.

5. The power distribution network of claim 1, wherein a capacitance of the second capacitor ranges between approximately 1 to 2 nFarads and an equivalent series resistance of the second capacitor is approximately 50 mOhms.

6. The power distribution network of claim 1, wherein the third path includes a capacitance of the first capacitor, an equivalent series inductance and an equivalent series resistance of the first capacitor, a substrate inductance, and an equivalent series resistance and a capacitance of the second capacitor.

7. The power distribution network of claim 6, wherein a capacitance of the first capacitor ranges between approximately 47 to 1000 nFarads and an equivalent series resistance of the first capacitor ranges between approximately 150 to 470 mOhms.

8. The power distribution network of claim 6, wherein a sum of the equivalent series inductance and the substrate inductance ranges between approximately 173 and 223 pHenries.

9. The power distribution network of claim 6, wherein a capacitance of the second capacitor ranges between approximately 1 to 2 nFarads and an equivalent series resistance of the second capacitor is approximately 50 mOhms.

10. A power distribution network comprising:
a substrate having first and second opposing surfaces and electrical interconnection paths disposed between the first and second surfaces;
an array of pins on the first surface of the substrate and coupled to the electrical interconnection paths in the substrate, wherein a ratio of power supply pins to input/output signal pins of the array of pins ranges between approximately 1:24 to 1:52;
a first capacitor mounted on the second surface of the substrate;
an integrated circuit mounted on the second surface of the substrate;
a second capacitor formed in the integrated circuit,
a low resistance direct current (DC) path coupling at least a pin of the array of pins to the second capacitor via a first electrical interconnection path of the electrical interconnection paths;

a low frequency path coupling at least a pin of the array of pins to the first capacitor via a second electrical interconnection path of the electrical interconnection paths; and a high frequency path coupling said first and second capacitors.

11. The power distribution network of claim 10, wherein a capacitance of the first capacitor ranges between approximately 47 and 1000 nFarads and an equivalent series resistance of the first capacitor ranges between approximately 150 to 470 mOhms.

12. The power distribution network of claim 10, wherein a capacitance of the second capacitor ranges between approximately 1 to 2 nFarads and an equivalent series resistance of the second capacitor is approximately 50 mOhms.

13. The power distribution network of claim 10, wherein the high frequency path includes a capacitance of the first capacitor, an equivalent series inductance and an equivalent series resistance of the first capacitor, a substrate inductance, and an equivalent series resistance and a capacitance of the second capacitor.

14. The power distribution network of claim 13, wherein the capacitance of the first capacitor ranges between approximately 47 to 1000 nFarads and the equivalent series resistance of the first capacitor ranges between approximately 150 to 470 mOhms.

15. The power distribution network of claim 13, wherein a sum of the equivalent series inductance of the first capacitor and the substrate inductance ranges between approximately 173 and 223 pHenries.

16. The power distribution network of claim 13, wherein a capacitance of the second capacitor ranges between approximately 1 to 2 nFarads and an equivalent series resistance of the second capacitor is approximately 50 mOhms.

17. A method for reducing a ratio of power supply pins to input/output supply pins in an array of pins on a first surface of a substrate, said method comprising:
forming a low resistance direct current (DC) path by coupling at least a pin of the array of pins to a first capacitor via a first electrical interconnection path of a plurality of electrical interconnection paths disposed in said substrate, wherein said first capacitor is an on die capacitor in an integrated circuit mounted on a second surface of said substrate;
forming a low frequency path by coupling at least a pin of the array of pins to a second capacitor via a second electrical interconnection path of the plurality of electrical interconnection paths, wherein the second capacitor is a decoupling capacitor mounted on the second surface of the substrate;
forming a high frequency path by coupling said first and second capacitors; and
limiting the ratio of power supply pins to input/output supply pins to range between approximately 1:24 and 1:52.

18. The method of claim 17, wherein a capacitance of the first capacitor ranges between approximately 47 and 1000 nFarads and an equivalent series resistance of the first capacitor ranges between approximately 150 to 470 mOhms.

19. The method of claim 17, wherein a capacitance of the second capacitor ranges between approximately 1 to 2 nFarads and an equivalent series resistance of the second capacitor is approximately 50 mOhms.

20. The method of claim 17, wherein the high frequency path includes a capacitance of the first capacitor, an equivalent series inductance and an equivalent series resistance of the first capacitor, a substrate inductance, and an equivalent series resistance and a capacitance of the second capacitor.

* * * * *